United States Patent [19]

Munetsugu et al.

[11] Patent Number: 4,587,519
[45] Date of Patent: May 6, 1986

[54] INPUT DEVICE

[75] Inventors: Eiichi Munetsugu; Hiroshi Ushiki, both of Yokohama, Japan

[73] Assignee: Tokyo Shibaura Denki Kabushiki Kaisha, Kawasaki, Japan

[21] Appl. No.: 397,763

[22] Filed: Jul. 13, 1982

[30] Foreign Application Priority Data

Jul. 15, 1981 [JP] Japan .................. 56-110206

[51] Int. Cl.[4] ........................................... G09G 3/00
[52] U.S. Cl. .................. 340/711; 340/365 R; 340/365 S
[58] Field of Search ............. 340/711, 712, 365 R, 340/365 S, 365 E

[56] References Cited

U.S. PATENT DOCUMENTS

| | | | |
|---|---|---|---|
| 3,950,743 | 4/1976 | Hatano et al. | 340/711 |
| 3,990,070 | 11/1976 | Spence | 340/711 |
| 4,070,664 | 1/1978 | Abe | 340/711 |
| 4,199,751 | 4/1980 | Piguet | 340/711 |
| 4,242,676 | 12/1980 | Piguet et al. | 340/711 |
| 4,277,784 | 7/1981 | Hyltin | 340/711 |
| 4,454,505 | 6/1984 | Harney et al. | 340/712 |

FOREIGN PATENT DOCUMENTS 5346646 6/1976 Japan .
2037046 7/1980 United Kingdom .

Primary Examiner—Gerald L. Brigance
Attorney, Agent, or Firm—Finnegan, Henderson, Farabow, Garrett & Dunner

[57] ABSTRACT

An input device in use for electronic calculators with a segment type display section of a plurality of digits comprises a key switch matrix supplied with at least some of the signals applied to the segment of the display section, a latch circuit for detecting the key operation and latching the input signal representative thereof, a control section for detecting the required operation according to the input signal from the latch circuit for performing the required operation in accordance with the input signal and for producing a display signal, and a selector gate circuit which supplies the signal containing key-in detection pulse when the key operation is not detected to the segments and the key switch matrix, and sequentially supplies the key-in judging pulse to the key switches on the column lines of the key switch matrix when the key operation is detected.

7 Claims, 26 Drawing Figures

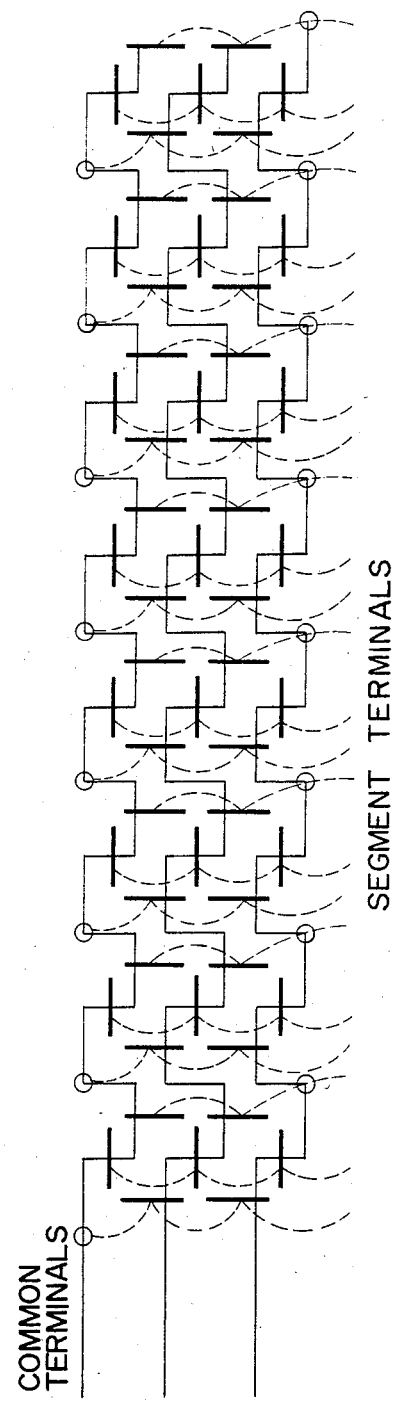

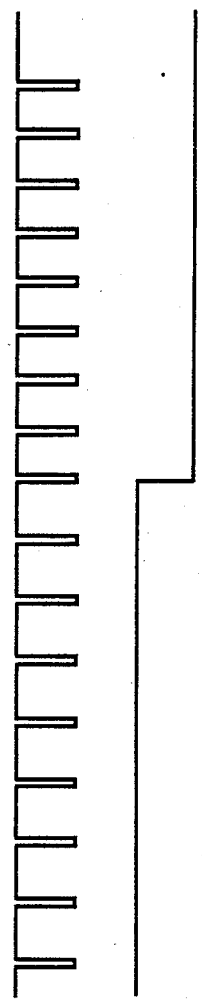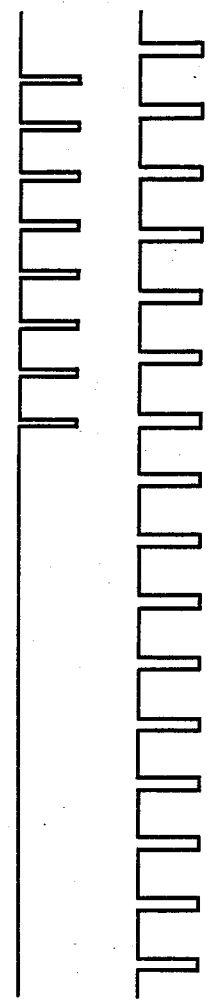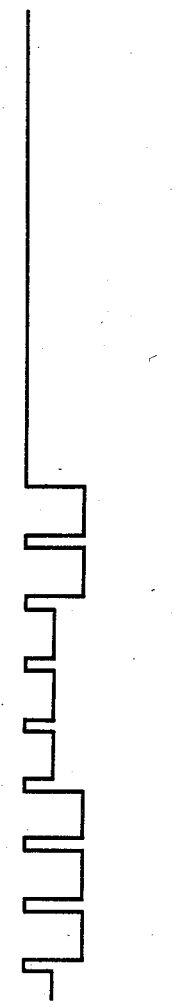
FIG. 4A
FIG. 4B
FIG. 4C
FIG. 4D
FIG. 4E
FIG. 4F
FIG. 4G

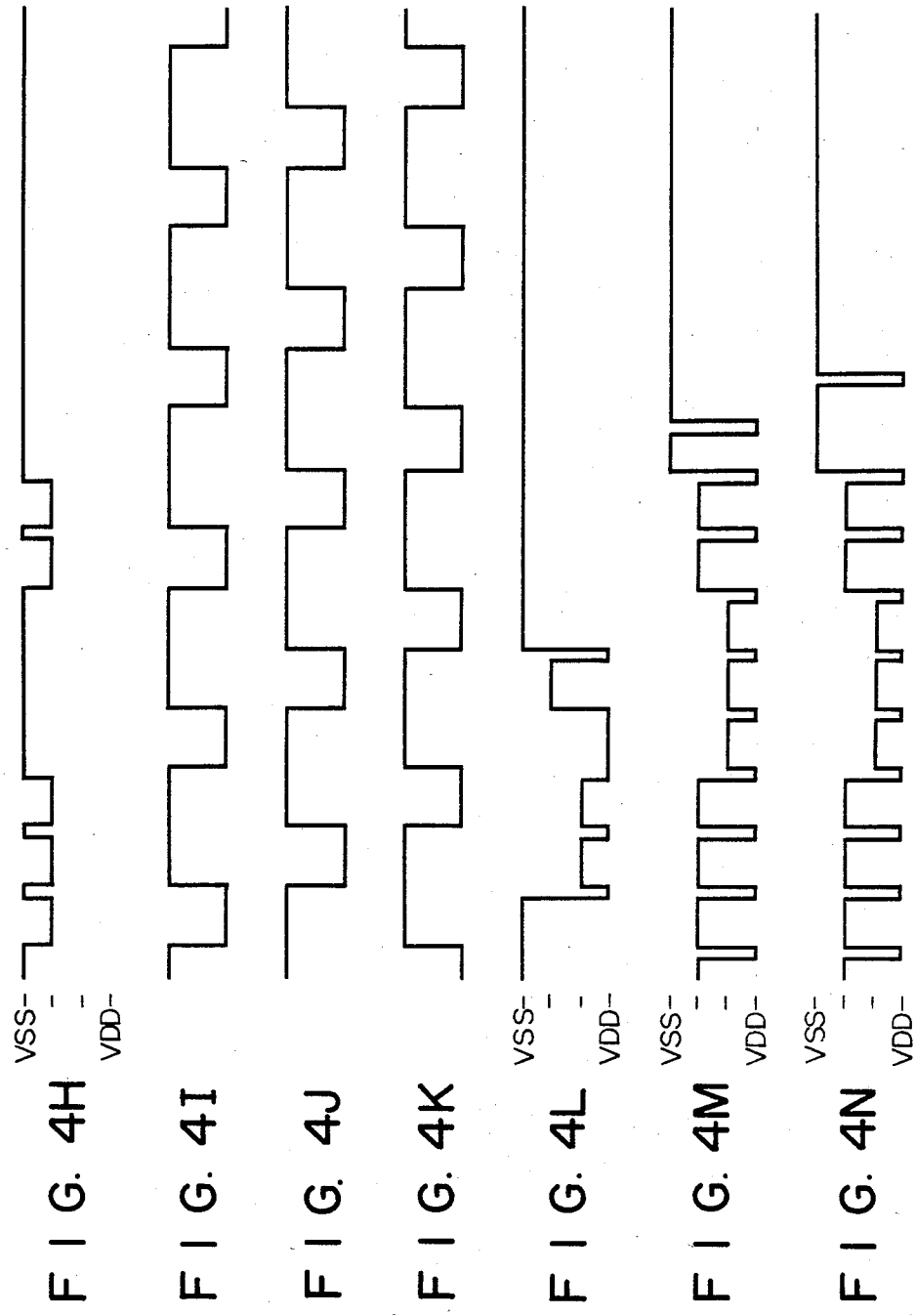

INPUT DEVICE

BACKGROUND OF THE INVENTION

The present invention relates to a key input device for use in a pocket-type electronic calculator that utilizes a single LSI chip for both arithmetic and operational functions.

In recent years, various types of electronic circuits have been fabricated into integrated circuits. For example, the arithmetic and operational circuits for electronic calculators are now frequently incorporated on a single LSI chip. With this development, the electronic calculator has remarkably been reduced in size to be handy and compact. The miniaturization has been accompanied by consumer demand for multiple functions, which requires an increased number of key switches. Any increase in the number of key switches leads to a complementary increase in the number of signals inputted to the operational circuit. A drawback of using a single chip for both circuit control and arithmetic processing is that the chip has a limited number of pins (terminals) which may be connected to the peripheral circuits. The necessary peripheral circuits include such features as the key-input device, the display panel and a power source. Thus, there have been numerous attempts to accommodate the increased number of inputs to the operational circuit.

Merely increasing the number of the key switches results in an increase in the number of terminals. This complicates the wiring of the circuit, which is undesirable from a circuit design standpoint. One approach is to design the key switch to have two or more functions, that is, use of the multifunction keys, to overcome the above problem. This approach, however, makes the key operation quite complicated. Another approach is to use common terminals for both the display and alphanumerical key terminals for time-divisional use. This approach also makes a problem in that an insufficient level for keying in data may occur and a variation in the threshold voltage of the judging circuit for the key-in signal may cause an erroneous data entry.

SUMMARY OF THE INVENTION

The present invention relates to a key input device for use in a pocket-type electronic calculator that utilize a single LSI chip for both the arithmetic and operational functions. A drawback of using a single chip for both circuit control and arithmetic processing is that the chip has a limited number of pins (terminals) which may be connected to peripheral circuits, such as the key-input device, the display section, and the power source. As a result of the limited number of terminals, the present invention utilizes some of its terminals to transfer multiple signals. A frequent problem encountered when multiple signals are inputted to a single terminal is that the triggering level of the key-in signal must be lowered. This can cause the control unit to misjudge the depressed key. An objective of the present invention is to solve that problem by producing a full-biased key-in detection signal.

To achieve these and other objectives, as embodied and broadly described herein, the present invention provides a calculator input device comprising a key switch matrix, a latching means, a control means, a display means and a selector gate means. The key switch matrix includes a plurality of key switches arranged in a matrix. The display means includes a plurality of character segment terminals.

The operation of the input device of the present invention can be divided into two modes, a key-wait mode (first mode) and a key-wait release mode (second mode). When there are not any key switches depressed, the operational mode is set to the key-wait mode. At this point the control means produces a display signal that is processed by the selector gate means before driving the display segments. When a key or a multiple number of keys are depressed, the operational mode is switched to the key-wait release mode. While the input device is in the key-wait release mode, the control means interrogates the key switch matrix to determine the activated key switch and performs the arithmetic function called for. When the arithmetic processing of the input data is completed, the operational mode is returned to the key-wait mode.

The latching means is responsible for producing the key-wait release mode signal anytime it detects the activation of a key switch. The latching means includes a plurality of latch circuits, each of which corresponds to a particular row of key switches in the key switch matrix. When the latching means generates a signal indicative of the key-wait release mode, the control means then identifies the depressed key and performs the arithmetic operation accordingly. When the arithmetic processing is completed, the operation mode of the calculator is returned to the key-wait mode.

The selector gate means includes a plurality of selector circuits. During the key-wait mode all of the selector circuits produce segment signals intended to drive the display digits in accordance with the display signal received from the control unit. The selector circuits are divided into two groups. The first group has the same number of selector circuits as there are columns in the key switch matrix, each one of which is connected to an associated column in the key switch matrix in addition to being connected to the display means. When the input device is in the key-wait release mode, the first group of selector circuits pass only key-in dectection clock signals received from the control unit. This allows the control unit to interrogate the key-switch matrix to determine the depressed key(s). At the same time, the remaining selector circuits, which comprise the second group of selector circuits, are made non-conductive.

Preferably, all of the selector circuits will include two gates. The first gate receives the display signal from the control means. The second gates of the first group of selector circuits receives the key-in detection clock signals from the control means. While the second gates of the second group of selector circuits receives the mode signal. Typically, the first group of gates will be clocked inverters and the second gates in the first group of selectors will be clocked NAND gates. The input device will also preferably include a voltage divider that will provide two different voltage signals to the selector circuit in response to clock signals it receives and the operational mode at that time.

The accompanying drawings, which are incorporated in and constitute a part of the specification, illustrate one embodiment of the invention and together with the description, serve to explain the principals of the invention.

BRIEF DESCRIPTION OF THE DRAWINGS

FIG. 3 illustrates a plan view of an electrode arrangement of a display section; and FIGS. 4A to 4U show timing charts useful in explaining the operation of the embodiment shown in FIG. 1.

DETAILED DESCRIPTION OF THE PREFERRED EMBODIMENT

Figure 1:
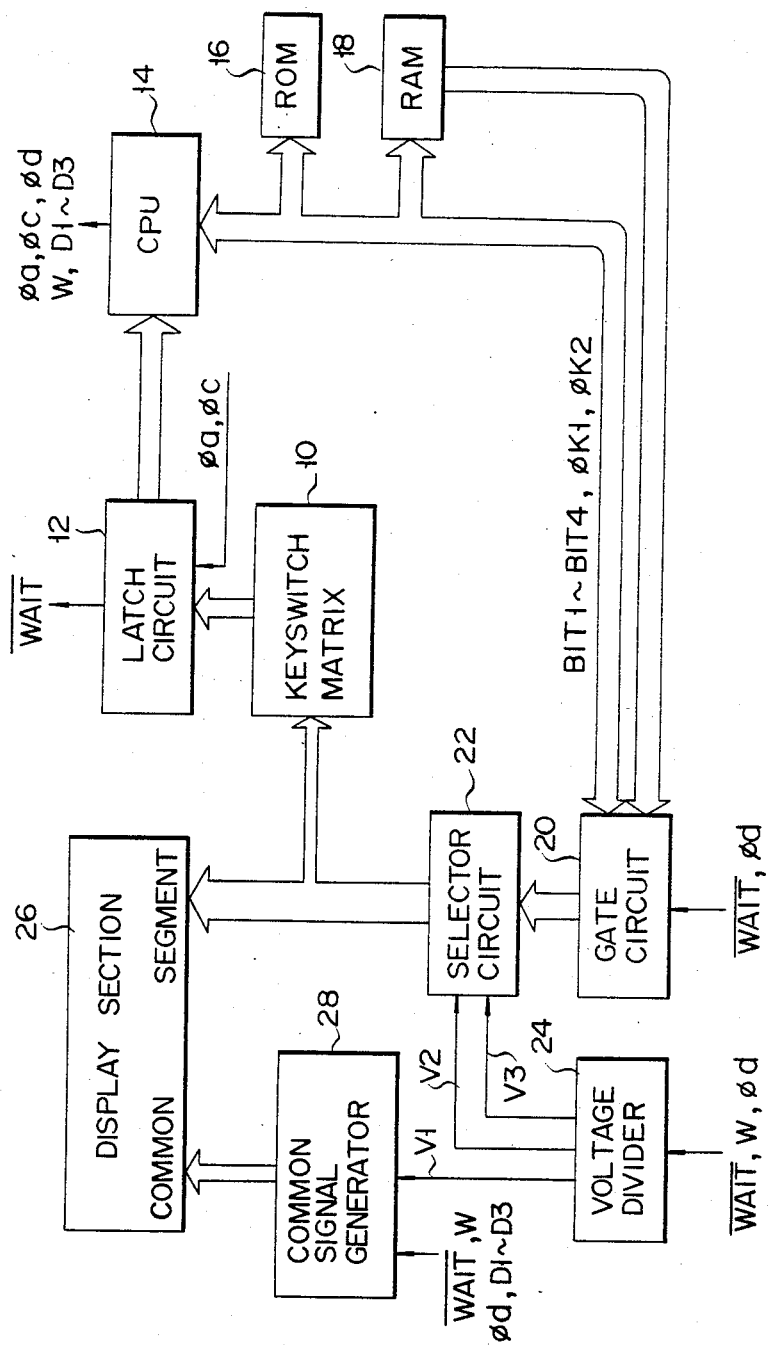
FIG. 1 is a block diagram of an embodiment of an input device according to the present invention.

An embodiment of an input device according to the present invention will be described referring to the accompanying drawings. In the present embodiment, the input device is applied to an electronic calculator. In FIG. 1 illustrating a block diagram of an electronic calculator, a signal derived from a key switch matrix 10 containing a plurality of key switches is supplied to a latch circuit 12. Clock signals $\phi a$ and $\phi c$ generated from CPU 14 are also supplied to the latch circuit 12. The latch circuit 12 produces a $\overline{\text{WAIT}}$ signal representing the presence or nonpresence of a key operation, latches a signal representing a key operation derived from the key switch matrix 10, and supplies the output signal to the CPU 14. The CPU 14, connected through a bus line to a ROM 16 and RAM 18. It cooperates with the ROM 16 and RAM 18 to determine which key is operated and execute the arithmetic operation according to the actuated key, and display the result of the operation. The CPU 14 produces clock signals $\phi a$, $\phi c$, $\phi d$, W, D1 to D3, BIT1 to BIT4, $\phi K1$ and $\phi K2$. A program necessary for processing these operations is stored in the ROM 16. The RAM 18 temporarily stores data and stores display data. The clock signals BIT1 to BIT4, $\phi K1$ and $\phi K2$, and the display data in the RAM 18 are supplied to the gate circuit 20. The gate circuit 20 is a clocked gate circuit operating in synchronism with clock signals $\overline{\text{WAIT}}$ and $\phi d$. The output signal from the gate circuit 20 is supplied to an input terminal of a selector circuit 22. Of three voltages V1 to V3 produced from a voltage divider 24, the voltage signals V2 and V3 are supplied to the selector circuit 22. The selector circuit 22 selects either the voltage signal V2 or V3 according to the input signal. The output signal from the selector circuit 22 is supplied to segment terminals of a display section 26 contained segment LCDs forming a plurality of digits. The output signals from the selector circuit 22 are partially applied to the key switch matrix 10. A V1 output signal of the voltage divider 24 is supplied to a common signal generator 28. The common signal generator 28 responds to the V1 voltage signal and the clock signals W, $\phi d$, and D1 to D3 from the CPU 14, and the $\overline{\text{WAIT}}$ signal from the latch circuit 12 to supply the output signal to common terminals of the display section 26.

Figure 2A:
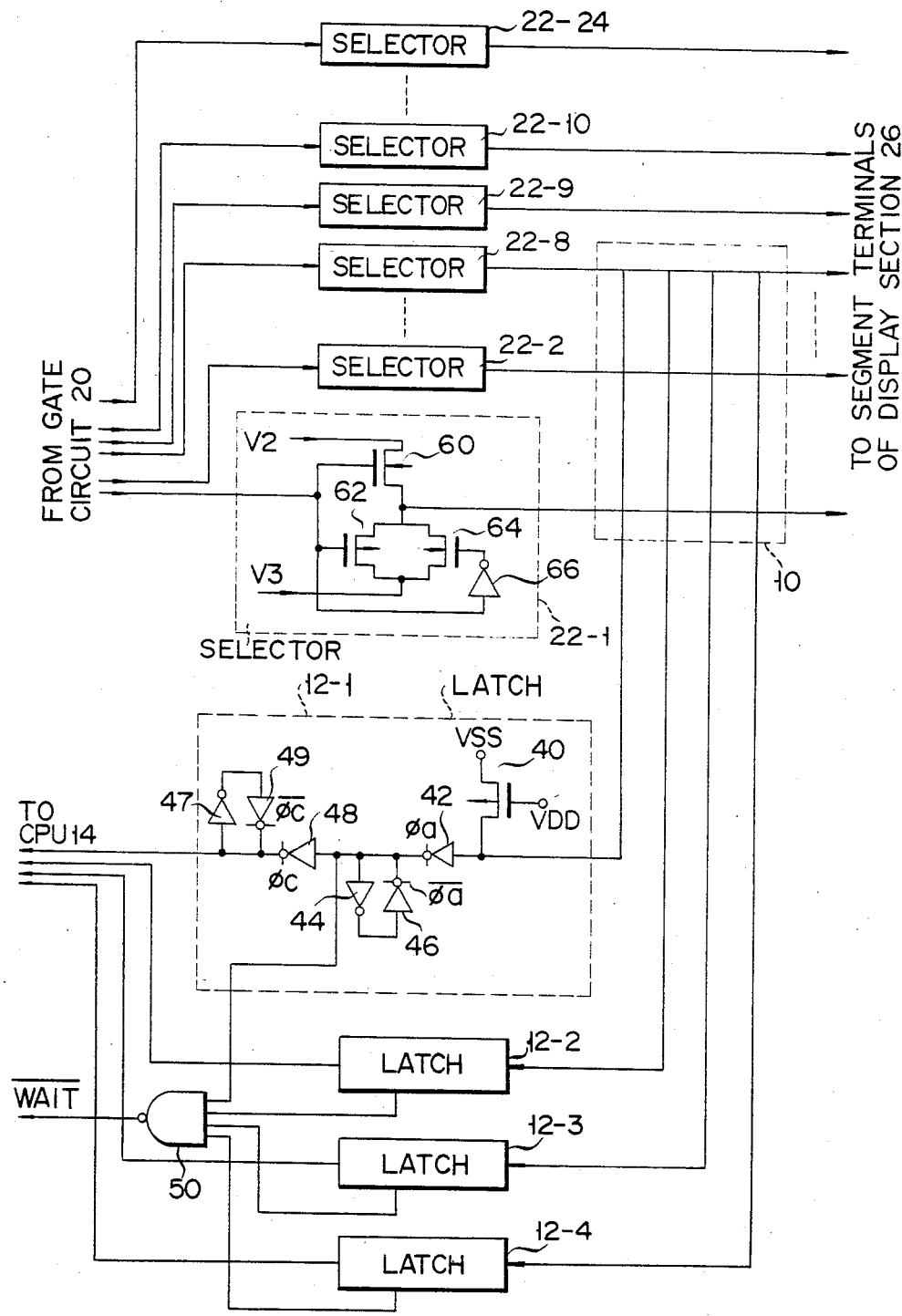
FIGS. 2A to 2C cooperatively show a practical arrangement of leading portions of the embodiment shown in FIG. 1.
Figure 2B:
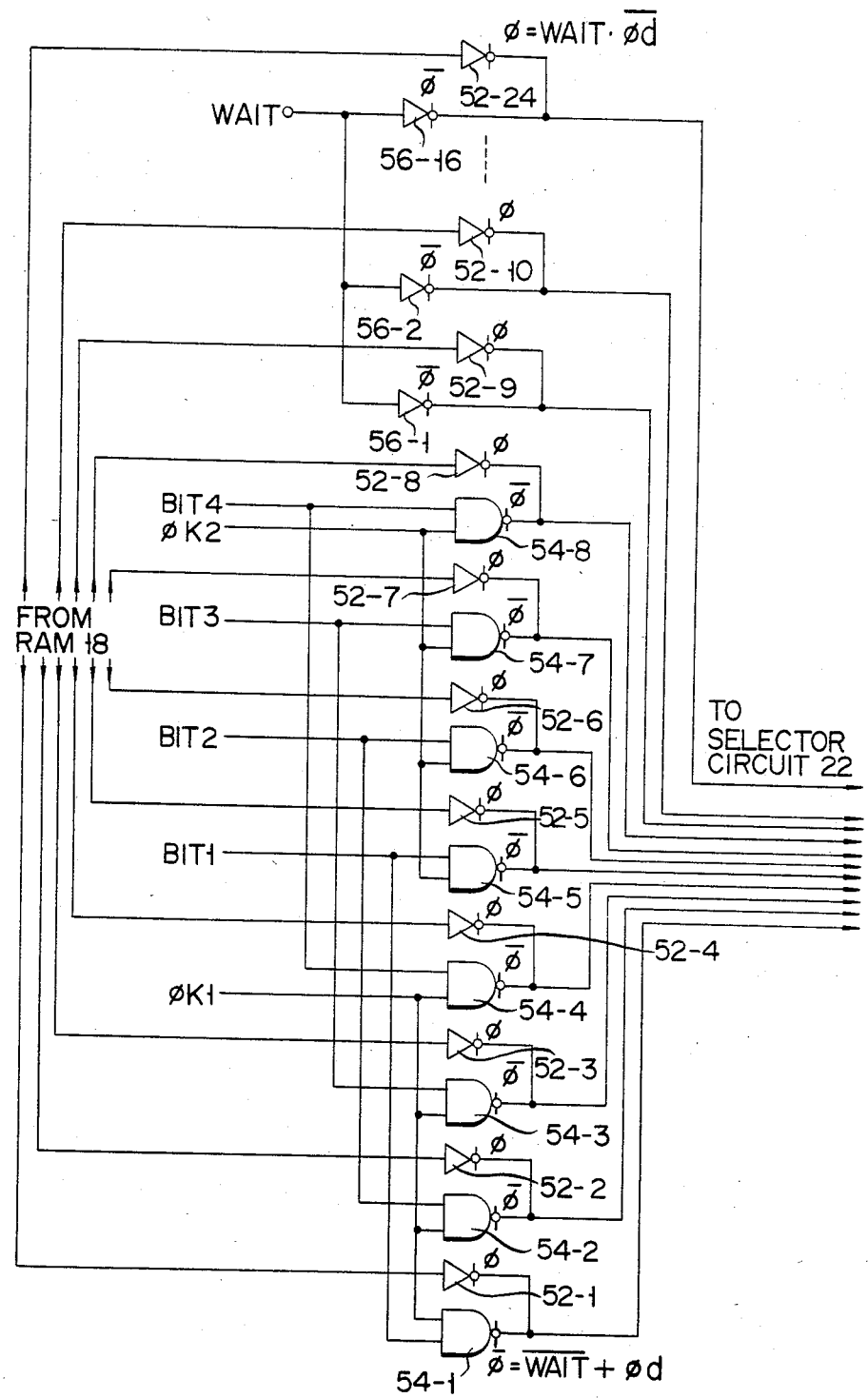

While the general arrangement of the present embodiment has been described, the detailed arrangement of it will be described referring to FIGS. 2A to 2C. The circuit arrangement shown in FIG. 2A corresponding to the selector circuit 22 and the latch circuit 12, that of FIG. 2B to the gate circuit 20, and that of FIG. 2C to the voltage divider 24 and common signal generator 28. The key switch matrix 10 is made up of 32 key switches arranged in a matrix 4 rows×8 columns. The display section 26 has eight digits as shown in FIG. 3. Each digit of the display section contains seven segment LCDs arranged in a numeral "8", and two LCDs representing dots located to the upper left and the lower right of the numeral for a total of nine segments. The display section 26 is driven with $\frac{1}{3}$ duty and $\frac{1}{3}$ prebias, for example. The driving method of the display section 26 is not limited to this method. The display section 26 has three segment electrodes for each digit and three common electrodes for whole digits. The total number of the segment electrodes is thus 24. Returning to FIG. 2A, the key switch matrix 10 is comprised of four row lines and eight column lines, and key switches located at the cross points of these row and column lines. The four row lines are connected to the input terminals of the latches 12-1 to 12-4, respectively. Each latch has the following arrangement. The input terminal of the latch is connected through a P-channel MOSFET 40 to a power supply terminal VSS (0 V) and through a clocked inverter 42 to the input terminal of an inverter 44 and the output terminal of a clocked inverter 46. A gate of the MOSFET 40 is connected to a power supply terminal VDD ($-3$ V). The output terminal of the inverter 44 is connected to the input terminal of the clocked inverter 46. The clocked inverter operates such that it produces an inverted output signal when receiving a clock signal of logic "1", but its output is at high impedance when the clock signal is logic "0". The clock signals to the clocked inverters 42 and 46 are $\phi a$ and $\overline{\phi a}$, respectively. The output signal from the clocked inverter 42 is produced through a clocked inverter 48 with a clock signal $\phi c$ and is supplied to the CPU 14 as a key input signal for each row. The output signal from the clocked inverter 42 in each latch is supplied to a NAND gate 50 which in turn produces a $\overline{\text{WAIT}}$ signal. The output signal from the clocked inverter 48 is refreshed by a refresh circuit made up of an inverter 47 and a clocked inverter 49 with a clock signal $\overline{\phi c}$.

Display data, supplied from the RAM 18 to the gate circuit 20, provide segment signals of 24 bits corresponding to segment electrodes of the display section 26. The segment signals from the RAM 18 are supplied to the input terminals of clocked inverters 52-1 to 52-24, as shown in FIG. 2B. The clock signal $\phi K1$ from the CPU 14 is supplied to the first input terminals of clocked NAND gates 54-1 to 54-4. The clock signal $\phi K2$ is supplied to the first input terminals of clocked NAND gates 54-5 to 54-8. The clock signal BIT1 from the CPU 14 is applied to the second input terminals of the clocked NAND gates 54-1 and 54-5; the BIT2 to the second input terminals of the clocked NAND gates 54-2 and 54-6; the clock signal BIT3 to the second input terminals of the clocked NAND gates 54-3 and 54-7; the clock signal BIT4 to the second input terminals of the clocked NAND gates 54-4 and 54-8. The clock signal $\phi$ to each of the clocked inverters 52-1 to 52-24 is $\overline{\text{WAIT}} \cdot \phi d$. The clock signal to each of the clocked NAND gates 54-1 to 54-8 is $\phi$ ($=\overline{\text{WAIT}} + \phi d$). The output terminals of the clocked inverters 52-1 to 52-8, and the output terminals of the clocked NAND gates 54-1 to 54-8 are respectively connected to each other, as shown, and each couple of the clocked inverter and the clocked NAND gate serves as a clocked wired OR gate. The WAIT signal is coupled with the output terminals of the clocked inverters 52-9 to 52-24 through the clocked inverters 56-1 to 56-16. The clock signal to each of the clocked inverters 56-1 to 56-16 is $\overline{\phi}$. Junction points of the output terminals of the clocked inverter 52 and the clocked NAND gate 54, and junction points between the output terminals of the clocked inverters 52 and the clocked inverters 56 are coupled with the selector circuit 22. The selector circuit 22 is comprised of selectors 22-1 to 22-24 corresponding to the output bits of the gate circuit 20, as shown in FIG. 2A. The output signal from the gate circuit 20 is connected directly to the gates of an N-channel MOSFET 60 and a P-channel MOSFET 62, and through an inverter 66 to the gate of an N-channel MOSFET 64. The V2 voltage signal from the voltage divider 24 is applied to the source of the MOSFET 60 and the V3 voltage signal is supplied to the drain of the MOSFETs 62 and 64. The drain of the MOSFET 60 are connected to the sources of the MOSFETs 62 and 64 and the junction point of these serves as an output terminal. The output terminals of the selectors 22-1 to 22-8 are connected to the column lines of the key switch matrix 10 and to the first to eighth segment electrodes of the display section 26. The output terminals of the selectors 22-9 to 22-24 are connected to the ninth to twenty-fourth segment electrodes of the display section 26.

Figure 2C:
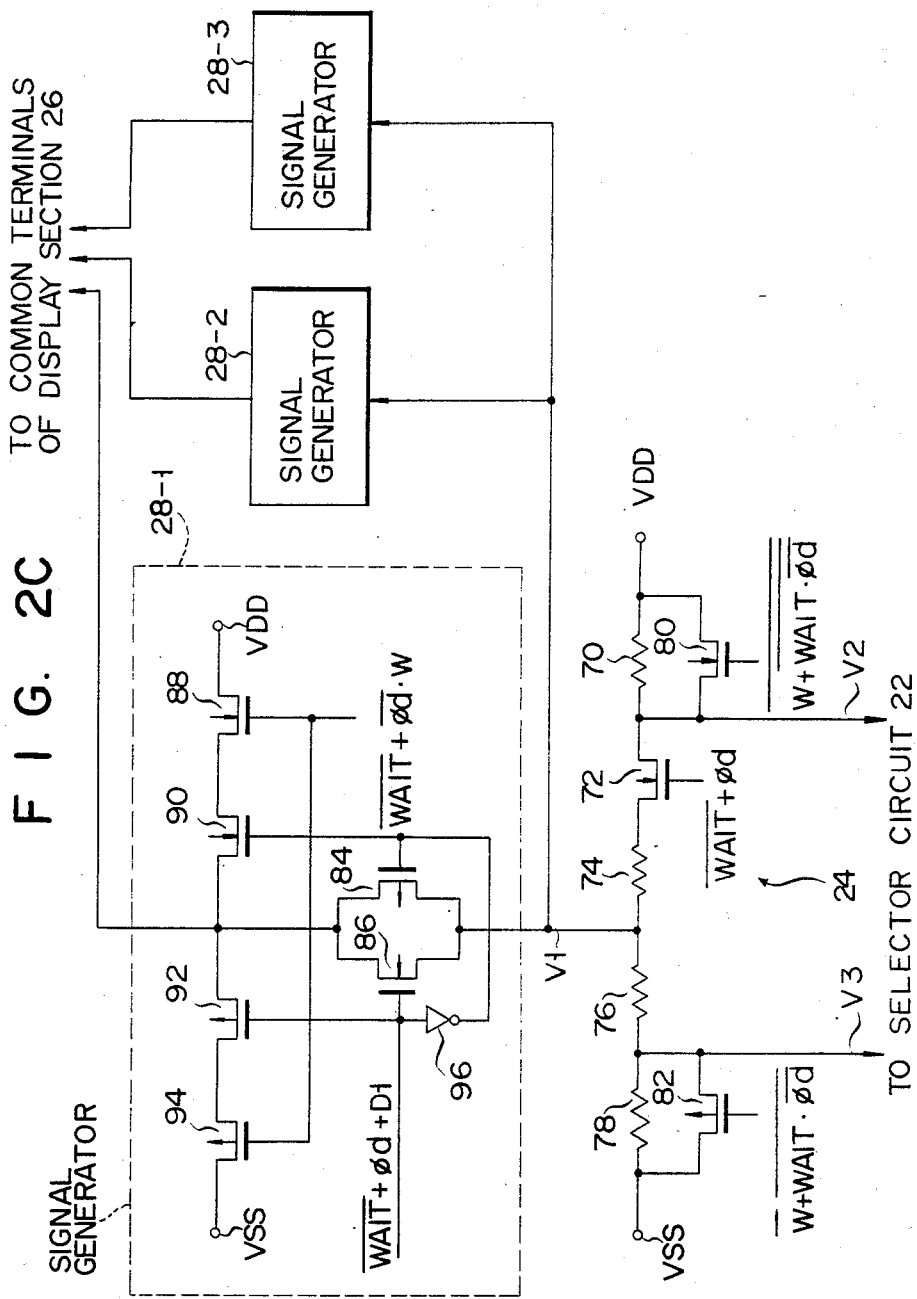

Now referring to FIG. 2C, the voltage divider 24 is comprised of the power source terminal VDD, a resistor 70, an N-channel MOSFET 72, resistors 74, 76 and 78, and the power source terminal VSS connected in series and an N-channel MOSFET 80 and a P-channel MOSFET 82 which are respectively connected to the resistors 70 and 78 in parallel. The $\overline{WAIT} + \phi d$ signal, $W + WAIT \cdot \phi d$ signal, and $\overline{W + WAIT \cdot \phi d}$ signal are applied to the gates of the MOSFETs 72, 80 and 82, respectively. The V1 voltage signal is derived from a connection point between the resistors 74 and 76; the V2 voltage from the connection point between the resistor 70 and MOSFET 72; the V3 voltage from the connection point between the resistors 76 and 78. A common signal generator 28 is made up of three signal generators 28-1 to 28-3 corresponding to the three common electrodes in the display section 26. The arrangement of each signal generator follows. The V1 voltage signal is applied to the sources of a P-channel MOSFET 84 and an N-channel MOSFET 86. N-channel MOSFETs 88 and 90, and P-channel MOSFETs 92 and 94 are connected in series between the power source terminals VDD and VSS. The connection point between the MOSFETs 90 and 92 is connected to the drains of the MOSFETs 84 and 86 and as an output terminal of the signal generator to the common terminal of the display section 26. The $\overline{WAIT} + \phi d + Di$ signal (Di signal is produced only for the signal generator 28-i) is supplied directly to the gates of the MOSFETs 86 and 92 and through an inverter 96 to the gates of the MOSFETs 84 and 90. The $\overline{WAIT} + \overline{\phi d} \cdot W$ signal is applied to the gates of the MOSFETs 88 and 94.

The operation of the embodiment thus arranged will be described referring to timing charts shown in FIGS. 4A to 4U. The operation of the embodiment may be classified into a key-wait mode and a key-wait release mode which executes the operated key judgment and the arithmetic operation. Upon power on, VDD is set at $-3$ V and VSS is set at 0 V. At this time, the latches 12-1 to 12-4 are pulled down at the input terminals since the MOSFET 40 is turned on. The clock signal $\phi a$ is produced at constant period, as shown in FIG. 4A. In the explanation to follow, the negative logic is employed for the logic state expression; logic "0" is allotted to VSS (0 V) and logic "1" to VDD ($-3$ V), and in the timing charts, the logic "1" is illustrated below the logic "0". If none of the key switches is closed, the output of the clocked inverter 42 is logic "1" when the $\phi a$ is logic "1". And the output signal $\overline{WAIT}$ of the NAND gate 50 is logic "0", as shown in FIG. 4B. When the clock signal $\phi a$ is logic "0", the output signal from the clocked inverter 42 remains unchanged and the $\overline{WAIT}$ signal is logic "0". Thus, the $\overline{WAIT}$ is logic "0" in the key-wait mode. The clock signal $\phi c$ is logic "0" in the key-wait mode, as shown in FIG. 4C.

The clock signals $\phi d$ and W are shown in FIGS. 4D and 4E. The signal $\phi d$ is used for timing the key input detection to be described later, and is produced at the same timing as that of the signal $\phi a$. The signal W is used for AC-driving the LCD of the display section 26 and changes its level every three periods of the signal $\phi d$. Since the $\overline{WAIT}$ signal continues its logic "0", levels of the voltage divided output signals V1 to V3 with relation to the clock signals W and $\phi d$ will be described referring to FIGS. 4F to 4H. When W="1" and $\phi d$="0", the MOSFETs 72 and 80 are ON and the MOSFET 82 is OFF, with the result that V2=VDD, V3=$\frac{1}{3}$ VDD and V1=$\frac{2}{3}$ VDD. When W="1" and $\phi d$="1", the MOSFETs 80 and 82 are ON and the MOSFET 72 is OFF, and V2=VDD, V3=VSS and V1=VSS. When W="0" and $\phi d$="0", the MOSFETs 72 and 82 are ON and the MOSFET 80 is OFF, so that V2=$\frac{2}{3}$ VDD, V3=VSS and V1=$\frac{1}{3}$ VDD. When W="0" and $\phi d$="1", the MOSFETs 80 and 82 are ON, while the MOSFET 72 is OFF, then V2=VDD, V3=VSS and V1=VSS.

The clock signals D1 to D3 supplied to the signal generators 28-1 to 28-3 connected to the first to third common electrodes are sequentially generated once for the half period of the signal W, as shown in FIGS. 4I, 4J and 4K. The output signals generated by the signal generators 28-1 to 28-3 in the common signal generator 28 are meaningful only during a period that the clock pulses D1 to D3 are produced. That is, during this period, these signals determines the common voltage so that the voltage between the common and segment electrodes of the segment LCD is $|\frac{1}{2}$ VDD$|$, i.e., sets the common voltage to VDD or VSS. The output signal from the signal generator 28-1 is illustrated, as an example, in FIG. 4L. When $\phi d$="0" and W=D1="1", the MOSFETs 94, 92 and 90 are ON, the output signal is VSS. When $\phi d$="1", the MOSFET 88 is ON and the MOSFET 94 is OFF, the output signal is VDD. When the clock signals $\phi d$ and D1 are logic "0", the MOSFETs 94, 84 and 86 are ON, while the MOSFETs 88, 90 and 92 are OFF. As a result, the output level is V1=$\frac{2}{3}$ VDD. When the clock signal $\phi d$ is "1", the MOSFETs 94, 84 and 86 are OFF, while the MOSFETs 88, 90 and 92 are ON, and the output level is VDD. When, the clock signal D1 is again "1", and the signals $\phi d$ and W are "0", the state of the MOSFET is unchanged and the output level is VDD. Even when the clock signal $\phi d$ is changed to "1", the output level is VDD. The same thing is true for the signal generators 28-2 and 28-3.

Explanation to follow is the level of segment signals supplied to the segment electrodes of the display section 26 and the column lines of the key switch matrix 10. In the key-wait mode, since the $\overline{WAIT}$ signal is "0", when the clock signal $\phi d$ is "0", the signal WAIT·$\overline{\phi d}$ is "1". Accordingly, the clocked inverters 52-1 to 52-24 operate in the gate circuit 20, while the clocked NAND gates 54-1 to 54-8 and the clocked inverters 56-1 to 56-16 do not operate. The selectors 22-1 to 22-24 respond to the inverted data of the display data from the RAM 18 to produce either of the signals V2 or V3 from the voltage divider 24 as a segment signal. FIGS. 4M, 4N and 4O illustrate segment signals produced from the selectors 22-1, 22-2 and 22-8, respectively. When the clock signal $\phi d$ is "1", the clocked inverters 52-1 to 52-24 do not operate, but the clocked NAND gates 54-1 to 54-8 and the clocked inverters 56-1 to 56-16 operate. At this time, the input signals $\phi K1$, $\phi K2$, and BIT1 to BIT4 to the clocked NAND gates 54-1 to 54-8 are all logic "1", as respectively shown in FIGS. 4P to 4U. The output signals from the clocked NAND gates 54-1 to 54-8 are logic "0". Therefore, the selectors 22-1 to 22-8 produce the V2 signal since the MOSFET 60 is ON. As shown in FIG. 4G, the V2 signal is at VDD level when the clock signal $\phi d$ is "1", so that the output segment signals from the selectors 22-1 to 22-8 are at VDD. The VDD pulse in the segment signal is the pulse for key-in detection, as described later. The other segment signals, i.e., the output level of the selectors 22-9 to 22-24 is logic "0" since the clocked inverters 56-1 to 56-16 operates, and thus is at the V3 level. As described above, in the key-wait mode, the display section 26 performs a normal display and stops its display operation instantaneously in response to the key-in detection pulse. If none of the keys is operated, the input terminal of the latch circuit 12 remains pulled down and the $\overline{WAIT}$ signal is left logic "0". Since the clock signal $\phi c$ is logic "0", the output signal from the latch circuit 12 is kept at logic "0".

When one key switch is closed, the key-in detection pulse is applied through the row line connected to the operated key to the latch circuit 12. The VDD pulse is latched as the clock signal $\phi a$ is "1", and the $\overline{WAIT}$ signal is logic "1", as shown in FIG. 4B. Then, the operation mode of the device is changed from the key-wait mode to the key-wait release mode. When the $\overline{WAIT}$ is logic "1", the clock signal $\phi c$ is logic "1" every given period, as shown in FIG. 4C, and the clock signals $\phi K1$, $\phi K2$, and BIT1 to BIT4 are logic "0", as shown in FIGS. 4P to 4U. Since $\overline{WAIT}$="1", $\overline{W+WAIT \cdot \phi d}$="1" and the MOSFET 82 is ON so that the V3 output level of the voltage divider 24 is equal to VSS. Also in the common signal generator 28, since $\overline{WAIT}$="1", the MOSFETs 92 and 94 are ON. Therefore, the common signal is subsequently at VSS. Also in the gate circuit 20, since $\phi = \overline{(WAIT+\phi d)}$ "1", so that the clocked inverters 52-1 to 52-24 are inoperative, while the clocked NAND gates 54-1 to 54-8 and the clocked inverters 56-1 to 56-16 operate. Accordingly, the display data from RAM 18 is not supplied to the selector circuit 22. Since the input signals to the clocked NAND gates 54-1 to 54-8 are all "0", the output levels of the clocked NAND gates 54-1 to 54-8 are all "1". The selectors 22-1 to 22-8 produces segment signals of the V3 level signal, i.e., VSS, since the MOSFET 62 is ON. The output signals from the selectors 22-9 to 22-24 are forcibly set at V3, for extinguishing the display. When detecting that the $\overline{WAIT}$ signal is "1", the CPU 14 produces the clock signals $\phi K1$, $\phi K2$ and BIT1 to BIT4 in synchronism with "1" of the clock signal $\phi a$ (FIG. 4A). The clock signal $\phi K1$ is logic "1" in synchronism with four clock pulses $\phi a$ after $\overline{WAIT}$="1", as shown in FIG. 4P. The clock signal $\phi K2$ is logic "1" in synchronism with the fifth to eighth clock pulses $\phi a$ after $\overline{WAIT}$="1", as shown in FIG. 4Q. The signals BIT1 to BIT4 are logic "1" in synchronism with the first and fifth, the second and sixth, the third and seventh, and the fourth and eighth $\phi a$ pulses after $\overline{WAIT}$="1", as shown in FIGS. 4R to 4U. Accordingly, if the device changes its operation mode to the key-wait release mode, the output signals of the clocked NAND gates 54-1 to 54-8 are sequentially "0" in synchronism with the clock pulse $\phi a$. That is, the segment signals from the selectors 22-1 to 22-8 sequentially become V2=VDD in synchronism with the clock pulse $\phi a$. FIGS. 4M, 4N and 4O illustrate the output signals from the selectors 22-1, 22-2 and 22-8. At the timing of the first clock pulse $\phi a$, the first column line is set at VDD by the selector 22-1. When none of the four key switches on the first column line are closed, the signal level at the input terminals of the latches 12-1 to 12-4 is left at VSS level. At the timing of "1" of the clock signal $\phi c$ (FIG. 4C), the output inverters 48 in the latches 12-1 to 12-4 operate, so that the output signals from the latch circuits 12-1 to 12-4 is "0" at the same timing. Then, "0", "0", "0", "0" level of the four bit signals are supplied to CPU 14. Subsequently, the second to eighth column lines are set at VDD and the output signal from the latch circuit 12 is applied to the CPU 14. Then, the CPU 14 judges which key is closed. For example, when the fourth column line is set at VDD and the second row line is at VDD, that is, the VDD level is latched in the latch 12-2, only the output of the latch 12-2 is "1" and "0", "1", "0", "0" signals are supplied to the CPU 14. At this time, the CPU 14 makes its decision on the basis of the logic level "1" signal. The CPU 14 executes the arithmetic operation or registration in accordance with the decision. The presence of two or more "1" level bits in the signal from the latch circuit 12 indicates that two or more keys are simultaneously pushed. In this case, such key operations are not treated as an accurate entry, and therefore or only the first "1" level bit is effective, but the latter "1" level bit being considered ineffective. After the termination of the operation/registration processing, the key-wait mode restarts under control of the CPU 14.

While the above-mentioned embodiment employs 4×8=32 key switches, the number of key switches can be further increased. The arrangements and operation of the input device when the number of the key switches is increased will be described. In case where the number of the row lines in the key switch matrix 10 remains the same but the number of the column lines is increased, the additional column lines are connected to the selectors 22-9 to 22-i. The clocked inverters 56-1 to 56-(i-8) in the gate circuit 20 corresponding to the selectors 22-9 to 22-i are replaced by clocked NAND gates 54-9 to 54-i, respectively. Then, the program in CPU 14 is changed to such a program as to provide the following operation. "1" level signals are sequentially supplied to the clocked NAND gates 54-1 to 54-i in synchronism with the clock signal $\phi c$ (FIG. 4C), as described above. The output signals from the clocked NAND gates 54-1 to 54-i are rendered "0" in succession and the output signals from the selectors 22-1 to 22-i are rendered "1" (VDD) in succession. With this arrangement, the number of the column lines in the key switch matrix 10 can be increased by the number of the segment electrodes in the display section 26. In this case, the display section 26 has three segment electrodes for each digit and totally eight digits. Accordingly, 24 row lines maximum can be increased. The row line more easily be increased than the column line. In this case, all a designer has to do is that the number of the latches in the latch circuit 12 is increased in accordance with the number of the row lines increased. As described above, the present embodiment of the invention provides a key input device which can readily increase the number of keys. When the key input device is used, a space necessary for installing keys is increased, however, there is no need for use of the multifunctional keys. Therefore, the key operation is simple.

It should be understood that the present invention is not limited to the above-mentioned embodiments. For example, the present invention is applied for general equipments with input devices and display sections. The key switches in the input device may be substituted by any other suitable means such as levers and buttons.

What we claim is:

1. A calculator apparatus comprising:
   a key switch matrix having a plurality of key switches arranged in rows and columns, said key switch matrix including a plurality of key switches arranged in a matrix;
   a latching means including a plurality of latch circuits wherein each said latch circuit is associated with a particular row of said key switch matrix and is operated by the closure of any of said key switches that constitute an associated row, said latch circuits being connected to said key switches that constitute the associated row, said latching means producing a mode signal based on the detection of a key switch closure, said mode signal representing a first mode when said key switches are all open and representing a second mode upon closure of at least one of said key switches and further producing output signals representing a row in which said one key switch is operated;
   control means for producing key-in detection clock signals having a level equal to an associated power supply level, for determining a closed key switch according to output signals from said latch means, for producing display signals having a level equal to a voltage-divided fraction of an associated power supply level, for executing arithmetic operations according to the result of said key switch determination, and for producing display signals representing a result of said arithmetic operations, said control means having a fixed number of signal input/output terminals;
   display means with a plurality of character segment terminals for displaying data; and
   selector gate means connected to said control means for supplying one of two operating voltage signals, said selector gate means including a first group of selectors wherein each member of said first selector group is connected to the segment terminals of said display means and is associated with a particular column of said key switch matrix, with each said first selector group member being connected to the key switches that constitute its associated column, said selector gate means further including a second group of selectors, each member of said second group of selectors being electrically isolated from said key switch matrix and being connected to said character segment terminals of said display means,
   said selector gate means including means responsive to the first mode signal for applying superposed signals composed of said key-in detection clock signals and the display signals to said display segment terminals and responsive to the second mode signal for applying said key-in detection clock signals to said key switches.

2. Apparatus according to claim 1 wherein:
   said control means further produces control clock signals and wherein each selector of said first selector group includes a first gate that receives the display signal from said control means and a second gate that receives the key-in detection clock signal from said control unit, said first and second gates being arranged such that their outputs are combined, and
   each selector in said selector group includes a third gate that receives the display signal from said control means and a fourth gate that allows the control clock signal to pass therethrough when the mode signal represents the first mode while being nonconductive when the mode signal represents the second mode, said third and fourth gates being arranged such that their outputs are combined.

3. Apparatus as specified in claim 2, wherein said selector gate means further includes:
   a voltage divider responsive to the first and second mode signals and said control clock signals, for producing a first voltage signal and a second voltage signal; and
   wherein said first and second group of selector circuits transmit either the first or the second voltage signal in response to the combined output of their corresponding gates.

4. Apparatus as specified in claim 2, wherein said first gates and said third gates are clocked inverters operating when the input device is in the first mode and the second gates are clocked NAND gates operating when the input device is in the second mode.

5. Apparatus as specified in claim 1, wherein said control means sequentially activates columns of said key switch matrix and determines the activated key switch based on the duration of the output signal of said latch means and the identity of an activated latching circuit.

6. A control circuit for an electronic calculator, which comprises:
   a matrix of key operated switches having row terminals and column terminals;
   a plurality of latch circuits individually connected to said row terminals and selectively operated upon actuation of an associated switch to switch an output signal from a key-wait mode to a key wait release mode;
   a display device having a plurality of character segment terminals:
   selector gate means having a first set of outputs connected to said display terminals and a second set of outputs made up of a portion of said first set of outputs connected to said column terminals;
   control means operated upon generation of said output signal key-wait release mode for applying key detection signals to said selector gate means to apply said key detection signals to said column terminals, the one of said latch circuits connected to the row terminal of an activated key switch providing a key switch signal back to said control means indicative of the activated key switch;
   said control means responding to said key switch signal to cause said latch circuits to switch said output signal to said key wait mode and to generate display signals and control clock signals; and
   means within said selection gate means responsive to said output signal key wait mode and said control clock signals for applying said display signals through said selector gate means to said display terminals.

7. A control circuit as defined in claim 6 wherein said control means has a fixed number of output terminals, and said key detection signals and said display signals are applied through the same output terminals.

* * * * *